United States Patent
Grundmann et al.

(10) Patent No.: US 10,304,997 B2
(45) Date of Patent: May 28, 2019

(54) III-NITRIDE LIGHT EMITTING DEVICE WITH A REGION INCLUDING ONLY TERNARY, QUATERNARY, AND/OR QUINARY III-NITRIDE LAYERS

(75) Inventors: Michael Jason Grundmann, Eindhoven (NL); Nathan Frederick Gardner, Eindhoven (NL); Werner Karl Goetz, Eindhoven (NL); Melvin Barker McLaurin, Eindhoven (NL); John Edward Epler, Eindhoven (NL); Francisco Alexander Leon, Eindhoven (NL)

(73) Assignee: Lumileds LLC, San Jose, CA (US)

( * ) Notice: Subject to any disclaimer, the term of this patent is extended or adjusted under 35 U.S.C. 154(b) by 532 days.

(21) Appl. No.: 13/882,744

(22) PCT Filed: Oct. 27, 2011

(86) PCT No.: PCT/IB2011/054791
§ 371 (c)(1),
(2), (4) Date: Mar. 20, 2014

(87) PCT Pub. No.: WO2012/059848
PCT Pub. Date: May 10, 2012

(65) Prior Publication Data
US 2015/0115299 A1    Apr. 30, 2015

Related U.S. Application Data

(60) Provisional application No. 61/409,158, filed on Nov. 2, 2010.

(51) Int. Cl.
*H01L 33/00* (2010.01)
*H01L 33/32* (2010.01)
(Continued)

(52) U.S. Cl.
CPC .......... *H01L 33/32* (2013.01); *H01L 21/0237* (2013.01); *H01L 21/0242* (2013.01);
(Continued)

(58) Field of Classification Search
CPC .......... H01L 21/0242; H01L 21/02458; H01L 21/76254; H01L 21/76256; H01L 33/007;
(Continued)

(56) References Cited

U.S. PATENT DOCUMENTS 5,173,751 A   12/1992   Hiroyuki et al.
5,530,267 A   6/1996    Brandle et al.
(Continued)

FOREIGN PATENT DOCUMENTS

EP    1840979       10/2007
JP    2007073575 A   3/2007

OTHER PUBLICATIONS

"InGaN/AiGaN Double-Heterostructure Blue Leds" Nakamura, MRS Proceedings vol. 339, Jan. 1, 1994, p. 173.
(Continued)

*Primary Examiner* — Dzung Tran
(74) *Attorney, Agent, or Firm* — Volpe and Koenig, PC

(57) ABSTRACT

A device includes a substrate (10) and a III-nitride structure (15) grown on the substrate, the III-nitride structure comprising a light emitting layer (16) disposed between an n-type region (14) and a p-type region (18). The substrate is a $RAO_3 (MO)_n$ where R is one of a trivalent cation: Sc, In, Y and a lanthanide; A is one of a trivalent cation: Fe (III), Ga and Al; M is one for a divalent cation: Mg, Mn, Fe (II), Co, Cu, Zn and Cd; and n is an integer$\geq 1$. The substrate has an inplane lattice constant $a_{substrate}$. At lease one III-nitride layer in the III-nitride structure has a bulk lattice constant $a_{layer}$ such that $[(|a_{substrate} - a_{layer}|)/a_{substrate}] * 100\%$ is no more than 1%.

18 Claims, 2 Drawing Sheets

(51) Int. Cl.
  *H01L 21/02* (2006.01)
  *H01L 33/10* (2010.01)
  *H01L 33/12* (2010.01)
  *H01L 33/06* (2010.01)
  *H01S 5/02* (2006.01)
  *H01S 5/183* (2006.01)
  *H01S 5/323* (2006.01)

(52) U.S. Cl.
  CPC .... *H01L 21/0254* (2013.01); *H01L 21/02458* (2013.01); *H01L 33/007* (2013.01); *H01L 33/0025* (2013.01); *H01L 33/0079* (2013.01); *H01L 33/06* (2013.01); *H01L 33/10* (2013.01); *H01L 33/12* (2013.01); *H01L 2924/0002* (2013.01); *H01S 5/0211* (2013.01); *H01S 5/0218* (2013.01); *H01S 5/18361* (2013.01); *H01S 5/32341* (2013.01)

(58) Field of Classification Search
  CPC .. H01L 33/0079; H01S 5/0211; H01S 5/0218; H01S 5/18361; H01S 5/32341
  USPC ................ 257/76, 96, 615, 13; 438/46, 607
  See application file for complete search history.

(56) References Cited

U.S. PATENT DOCUMENTS

| | | | |
|---|---|---|---|
| 5,652,551 A * | 7/1997 | Wittstruck | 331/107 R |
| 6,156,581 A | 12/2000 | Vaudo | |
| 6,218,280 B1 | 4/2001 | Kryliouk | |
| 7,915,624 B2 | 3/2011 | Jorgenson | |
| 2004/0012011 A1* | 1/2004 | Tomiya et al. | 257/13 |
| 2006/0097269 A1* | 5/2006 | Lester | 257/79 |
| 2007/0057282 A1* | 3/2007 | Kinoshita et al. | 257/133 |
| 2007/0072324 A1 | 3/2007 | Krames et al. | |
| 2010/0133504 A1* | 6/2010 | Wang et al. | 257/13 |

OTHER PUBLICATIONS

Structural Classification of RAO3 (MO) n Compounds Mohri et al, Journal of Solid State Chemistry vol. 78, 1989, p. 98-107.
ScAlMg04: An Oxide Substrate for GaN Epitaxy Hellman et al, MRS Proceedings, vol. 395, Jan. 1, 1995 p. 51-54.
Brandle et al., "Dry and Wet Etching of ScAlMg04," Solid State Electronics vol. 42, No. 3, pp. 467-469 (1998).

* cited by examiner

III-NITRIDE LIGHT EMITTING DEVICE WITH A REGION INCLUDING ONLY TERNARY, QUATERNARY, AND/OR QUINARY III-NITRIDE LAYERS

BACKGROUND

Field of Invention

The present invention relates to a III-nitride light emitting device. The III-nitride device may be grown on a substrate that is more closely lattice matched to the III-nitride layers than conventional substrates.

Description of Related Art

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers formed over the substrate, one or more light emitting layers in an active region formed over the n-type layer or layers, and one or more p-type layers formed over the active region. The n-type layers may be doped with, for example, Si and the p-type layers may be doped with, for example, Mg. Electrical contacts are formed on the n- and p-type regions.

Since III-nitride substrates are generally expensive and not widely available, III-nitride devices are often grown on sapphire or SiC substrates. These substrates are less than optimal because sapphire and SiC have different lattice constants than the III-nitride layers grown on them, causing strain and crystal defects in the III-nitride device layers, which can cause poor performance and reliability problems.

SUMMARY

It is an object of the invention to form a III-nitride device structure on a substrate that is more closely lattice matched to at least some of the III-nitride device layers than sapphire or SiC.

A method according to embodiments of the invention includes growing a III-nitride structure grown on a substrate, the III-nitride structure comprising a light emitting layer disposed between an n-type region and a p-type region. The method further includes attaching the III-nitride structure to a mount and removing the substrate. The substrate is $RAO_3(MO)_n$, where R is one of a trivalent cation, Sc, In, Y, and a lanthanide; A is one of a trivalent cation, Fe (III), Ga, and Al; M is one of a divalent cation, Mg, Mn, Fe (II), Co, Cu, Zn and Cd; and n is an integer$\geq 1$. The substrate has an in-plane lattice constant $a_{substrate}$ and at least one III-nitride layer in the III-nitride structure has a bulk lattice constant $a_{layer}$. In some embodiments $[(|a_{substrate}-a_{layer}|)/a_{substrate}]*100\%$ is no more than 1%.

In embodiments of the invention, a device includes a substrate and a III-nitride structure grown on the substrate, the III-nitride structure comprising a light emitting layer disposed between an n-type region and a p-type region. The substrate is $RAO_3(MO)_n$, where R is one of a trivalent cation, Sc, In, Y, and a lanthanide; A is one of a trivalent cation, Fe (III), Ga, and Al; M is one of a divalent cation, Mg, Mn, Fe (II), Co, Cu, Zn and Cd; and n is an integer$\geq 1$. The substrate has an in-plane lattice constant $a_{substrate}$. At least one III-nitride layer in the III-nitride structure has a bulk lattice constant $a_{layer}$. The percentage difference between the substrate in-plane lattice constant and the bulk lattice constant of at least one layer in the III-nitride structure, as defined by $[(|a_{substrate}-a_{layer}|)/a_{substrate}]*100\%$, is no more than 1%.

The device structures described herein may have less strain and therefore better performance than conventionally grown III-nitride light emitting devices grown on sapphire or SiC.

DETAILED DESCRIPTION

As used herein, BAlGaInN may refer to a binary, ternary, quaternary, or quinary alloy of boron, aluminum, gallium, indium, and nitrogen.

In embodiments of the invention, a III-nitride device structure is grown on a substrate that is more closely lattice matched to at least part of the III-nitride film than conventional substrates. The substrate may have the same hexagonal symmetry as the III-nitride film. Since the substrate is more closely lattice matched to the device structure, fewer defects or inhomogeneities may be incorporated in the III-nitride device structure during growth, which may result in better performance of the III-nitride device.

Figure 1:
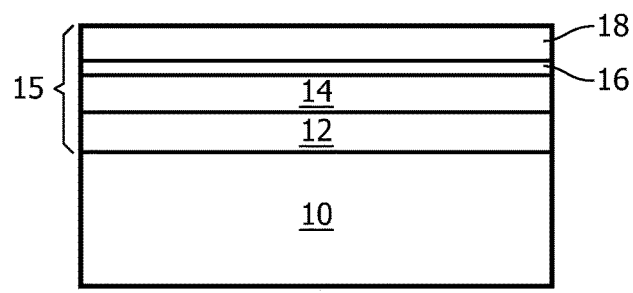
FIG. 1 illustrates a III-nitride device structure grown on a substrate.

FIG. 1 illustrates a III-nitride film 15 comprised of one or more layers grown on a growth substrate 10 according to embodiments of the invention. A semiconductor layer may be characterized by a bulk lattice constant and an in-plane lattice constant. The bulk lattice constant is the lattice constant of a free-standing layer of the same composition as the semiconductor layer. The in-plane lattice constant is the lattice constant of the semiconductor layer as grown. If the semiconductor layer is strained, the bulk lattice constant is different from the in-plane lattice constant. Growth substrate 10 may be a non-III-nitride material with an in-plane lattice constant $a_{substrate}$ within 1% of the bulk lattice constant $a_{layer}$ of the III-nitride film 15 in some embodiments, and within 0.5% of the bulk lattice constant of the III-nitride film 15 some embodiments. In other words, $[(|a_{substrate}-a_{layer}|)/a_{substrate}]*100\%$ is no more than 1% in some embodiments, and no more than 0.5% in some embodiments. For purposes of embodiments of the present invention, the bulk lattice constant of a ternary or quaternary AlInGaN layer may be estimated according Vegard's law, which for $Al_xIn_yGa_zN$ may be expressed as $a_{AlInGaN}=x(a_{AlN})+y(a_{InN})+z(a_{GaN})$, where the variable "a" refers to the bulk a-lattice constant of each binary material and $x+y+z=1$. AlN has a bulk lattice constant of 3.111 Å, InN has a bulk lattice constant of 3.544 Å, and GaN has a bulk lattice constant of 3.1885 Å.

In some embodiments, growth substrate 10 has similar or the same hexagonal basal plane symmetry as the III-nitride film 15. In some embodiments, growth substrate 10 is substantially impervious to attack by the chemical and thermal environment experienced during the deposition of the III-nitride film 15. In some embodiments, growth substrate 10 has an in-plane coefficient of thermal expansion within 30% of that of the III-nitride film 15. In some embodiments, growth substrate 10 may or may not be transparent to near-UV radiation. In some embodiments, growth substrate 10 is a single crystal or substantially single crystal material.

In some embodiments, growth substrate 10 is a material of general composition $RAO_3(MO)_n$, where R is a trivalent cation, often selected from Sc, In, Y, and the lanthanides (atomic number 57-71); A is also a trivalent cation, often selected from Fe (III), Ga, and Al; M is a divalent cation, often selected from Mg, Mn, Fe (II), Co, Cu, Zn and Cd; and n is an integer $\geq 1$. In some embodiments, $n \leq 9$ and in some embodiments, $n \leq 3$. In some embodiments, $RAMO_4$ (i.e., n=1) compounds are of the $YbFe_2O_4$ structure type, and $RAO_3(MO)_n (n \geq 2)$ compounds are of the $InFeO_3(ZnO)_n$ structure type.

Examples of suitable materials for growth substrate 10 and lattice-matched InGaN are listed below:

| Material | Lattice constant a (Å) | Appearance | y in lattice-matched $Al_xIn_yGa_{1-x-y}N$, x = 0 |
|---|---|---|---|
| $InFeZn_2O_5$ | 3.309 | Brown | 0.34 |
| $InFeZn_8O_{11}$ | 3.276 | Brown | 0.25 |
| $ScGaMgO_4$ | 3.272 | Transparent | 0.24 |
| $ScAlMgO_4$ | 3.236 | Transparent | 0.14 |
| $InAlMgO_4$ | 3.29 | Transparent | 0.29 |
| $ScAlMnO_4$ | 3.26 | Transparent | 0.20 |
| $InFeMnO_4$ | 3.356 | Brown | 0.48 |
| $InAlMnO_4$ | 3.319 | Black | 0.37 |
| $InAlCoO_4$ | 3.301 | Black | 0.32 |
| $InGaFeO_4$ | 3.313 | Black | 0.36 |

These and related substrate materials are described in detail by Kimizuka and Mohri in "Structural Classification of $RAO_3(MO)_n$ Compounds (R=Sc, In, Y, or Lanthanides; A=Fe(III), Ga, Cr, or Al; M=Divalent Cation; n=1-11)", published in Journal of Solid State Chemistry 78, 98 (1989), which is incorporated herein by reference. In some embodiments, $ScGaAlMgO_4$ is suited to growing a strain-free or strain-reduced device emitting light between 440 and 510 nm. In some embodiments, $InFeMnO_4$ is suited to growing a strain-free or strain-reduced device emitting orange or red light.

In some embodiments, III-nitride film 15 is grown on a surface of growth substrate 10 that is "miscut" or angled relative to a major crystallographic plane of the substrate. In some embodiments, the surface of growth substrate 10 on which III-nitride film 15 is grown may be oriented between −10 and +10 degrees away from the basal (0001) plane. In some embodiments, miscuts between −0.15 and +0.15 degrees tilted from the (0001) plane may result in large atomic terraces on the substrate surface that may desirably reduce the number of defects formed at terrace edges. The direction of the miscut may be in a specific crystallographic direction (for example, towards the (10-10) direction), or in a random crystallographic direction.

III-nitride film 15 is deposited on substrate 10 by any of the means known in the art, including, for example, MOCVD, hydride vapor phase epitaxy, or MBE. Perfect lattice match between the base layer 12 of III-nitride film 15 and the substrate 10 is not necessary, although lattice match within 0.1% may permit the deposition of high-quality III-nitride films 15 at least 50 μm thick.

In some embodiments, a base layer or region 12 is grown first on substrate 10, before the device structure which includes an active region 16 sandwiched between an n-type region 14 and a p-type region 18. The base region 12 may be any material on which a III-nitride device structure may be grown. Base region 12 often includes a ternary (such as $In_yGa_{1-y}$N or $Al_xGa_{1-x}$N) or quaternary (such as $Al_xIn_yGa_{1-x-y}$) alloy of III-nitride or other III-V material. As illustrated in the above table, in some embodiments the fraction of In y in an $In_yGa_{1-y}$N base region 12 may be between 0.14 and 0.48.

As illustrated in FIG. 1, a semiconductor device structure may be grown on base region 12. Though in the examples below the semiconductor device structure is a III-nitride LED that emits visible or UV light, other devices such as electronic and optoelectronic devices such as laser diodes, high electron mobility transistors, and heterojunction bipolar transistors may be formed on the substrates described herein.

The semiconductor structure includes a light emitting or active region 16 between n- and p-type regions 14 and 18. An n-type region 14 is typically grown first and may include multiple layers of different compositions and dopant concentration including, for example, preparation layers such as buffer layers or nucleation layers, which may be n-type or not intentionally doped, and n- or even p-type device layers designed for particular optical or electrical properties desirable for the light emitting region to efficiently emit light. In some embodiments, at least a portion of base region 12 is doped with an n-type dopant and a separate n-type region 14 is omitted.

A light emitting or active region 16 is grown over the n-type region. Examples of suitable light emitting regions include a single thick or thin light emitting layer, or a multiple quantum well light emitting region including multiple thin or thick light emitting layers separated by barrier layers.

A p-type region 18 is grown over the light emitting region. Like the n-type region, the p-type region may include multiple layers of different composition, thickness, and dopant concentration, including layers that are not intentionally doped, or n-type layers.

In some embodiments, the lattice constants of the substrate and the layers in the III-nitride film 15 are sufficiently matched that ternary, quaternary, and quinary layers in the III-nitride film 15 may be grown thicker than in devices grown on conventional substrates. In a device with an active region configured to emit light having a peak wavelength between 420 and 480 nm in some embodiments, between 440 nm and 460 nm in some embodiments, and greater than 440 nm in some embodiments, a region of semiconductor material including only ternary, quaternary, and quinary III-nitride layers (no binary III-nitride layers) is thicker than 2 in some embodiments, thicker than 3 μm in some embodiments, and thicker than 5 μm in some embodiments. The strain in every layer of the region of semiconductor material including only ternary, quaternary, and quinary III-nitride layers may be less than 1% in some embodiments, less than 0.8% in some embodiments, and less than 0.5% in some embodiments. Strain is defined as $[(|a_{layer}-a_{in-plane}|)/a_{layer}]*100\%$, where $a_{layer}$ is the lattice constant of a layer of the same composition as each layer when fully relaxed, which is estimated according to Vegard's law, and $a_{in-plane}$ is the lattice constant of each layer as grown in the device.

In the simplest form, base region 12 may be a single layer. The base layer is often a compound of BAlGaInN, chosen such that its lattice constant is sufficiently matched to substrate 10 that thick device layers may be grown. For a ScMgAlO$_4$ substrate 10, a base layer of $In_{0.14}Ga_{0.86}N$ is lattice-matched to the substrate, which has a lattice constant of 3.236 Å. Such a base layer may have a small enough band gap that it undesirably absorbs light emitted by the light emitting region. Larger band-gap base layers may be achieved with the addition of Al to the compound, such that the base layer is a quaternary III-nitride layer. The condition to maintain lattice matching in a quaternary $Al_xIn_yGa_{1-x-y}N$ layer grown on a ScAlMgO$_4$ substrate is $y=0.136+0.228*x$, $x+y\le 1$. $Al_{0.32}In_{0.21}Ga_{0.47}N$ and $Al_{0.71}In_{0.29}N$ are also lattice-matched to ScAlMgO$_4$. For example, a device may include a ScAlMgO$_4$ substrate, an $In_{0.14}Ga_{0.86}N$, $Al_{0.32}In_{0.21}Ga_{0.47}N$, or $Al_{0.71}In_{0.29}N$ base layer, an optional $In_{0.14}Ga_{0.86}N$ n-type layer, an $In_yGa_{1-y}N$ light emitting layer with an indium composition y greater than 0.14, and an $In_{0.14}Ga_{0.86}N$ p-type layer. In such a device, the base layer, n-type layer, and p-type layer are lattice matched to the substrate. The light emitting layer is strained.

In the case of a ScAlMgO$_4$ substrate, selecting a base layer composition with a lattice constant other than 3.236 Å may result in tensile or compressive strain in the base layer and the rest of III-nitride film 15. The strain in the base layer, defined as $[(|a_{layer}-a_{in-plane}|)/a_{layer}]*100\%$, where $a_{layer}$ is the lattice constant of a layer of the same composition as the base layer when fully relaxed, which is estimated according to Vegard's law, and $a_{in-plane}$ is the lattice constant of the base layer as grown in the device, is less than 1% in some embodiments, less than 0.5% in some embodiments, and less than 0.1% in some embodiments, in order to keep the number of defects small enough to maintain device performance.

In some embodiments, the composition of the base layer is selected such that an interface between the base layer and the next layer grown over the base layer (often an n-type layer or part of the active region) has little or no polar charge. In other words, in some embodiments, the base layer is polarization-matched to one or more other layers in the device. Quaternary layers of $Al_xIn_yGa_{1-x-y}N$ grown on a ScAlMgO$_4$ substrate are polarization matched to each other when the aluminum and indium compositions satisfy $x=2*y-0.28$ for $0.14\le y\le 0.32$. For example, $Al_{0.06}In_{0.17}Ga_{0.77}N$ is polarization-matched, although not lattice-matched, to $In_{0.14}Ga_{0.86}N$. One example of a device includes a ScAlMgO$_4$ substrate, an $Al_{0.06}In_{0.17}Ga_{0.77}N$ base layer, an $In_{0.14}Ga_{0.86}N$ n-type layer, an $In_yGa_{1-y}N$ light emitting layer with an indium composition y greater than 0.14, and $In_{0.1}Ga_{0.86}N$ p-type layer. The base layer, n-type layer, and p-type layer are polarization-matched. The n-type layer and p-type layer are lattice-matched to the substrate. The base layer and light emitting layer are strained.

In some embodiments, the base layer is doped with any suitable dopant including, for example, Si and/or Ge. The base layer may be doped to concentrations between $1\times 10^{16}$ and $1\times 10^{21}$ cm$^{-3}$ in some embodiments and between $5\times 10^{18}$ and $2\times 10^{19}$ cm$^{-3}$ in some embodiments, to achieve high enough conductivity to support conduction from the contacts to the active region. Doping in the base layer may be optimized to reduce current crowding and resistive losses. In some embodiments, the base layer is doped to have a sheet resistance less than 30 to avoid current crowding.

Figure 2:
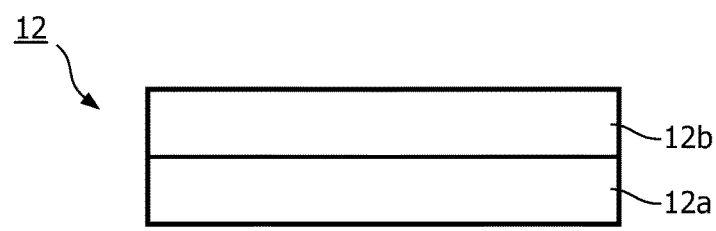
FIGS. 2, 3, and 4 illustrate examples of the base region illustrated in FIG. 1.
Figure 3:
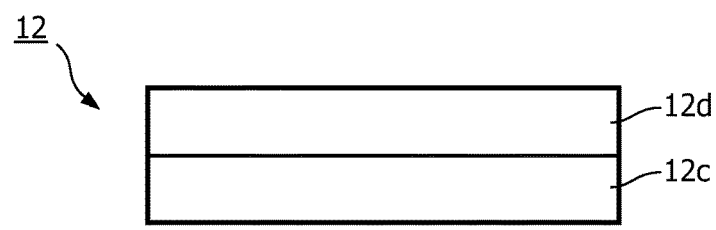
Figure 4:
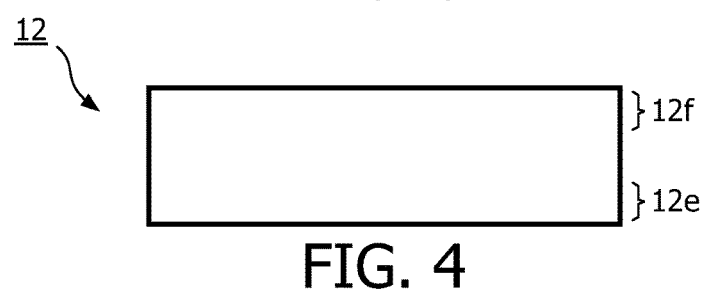

FIGS. 2, 3, and 4 illustrate other examples of possible base regions 12. Any of the base regions illustrated in FIGS. 2, 3, and 4 may be incorporated in the structure illustrated in FIG. 1. In some embodiments, different features or layers of the different base regions described in FIGS. 2, 3, and 4 may be combined.

Lateral conductivity in regions may be enhanced though the use of heterostructures. In the structure illustrated in FIG. 2, base region 12 includes at least two layers, a first layer 12a with a smaller band gap and a second layer 12b with a larger band gap. In some embodiments, both layers 12a and 12b are doped. The doped larger band gap layer 12b may donate electrons to a 2-dimensional electron gas (2DEG) at the interface between layers 12a and 12b, which may increase carrier density and/or mobility in the transverse direction, as compared to a single base layer. In some embodiments, the compositions of layers 12a and 12b are selected such that the net polarization-induced charge at the interface of 12a and 12b is zero. One of layers 12a and 12b may be lattice-matched to the substrate. First layer 12a may be a quaternary layer $Al_xIn_yGa_{1-x-y}N$ between 3 and 1000 nm thick and doped with Si or any n-type dopant with a concentration between $5\times 10^{17}$ and $2\times 10^{19}$ cm$^{-3}$ or it may not be intentionally doped. The second layer 12b may be a quaternary layer $Al_xIn_yGa_{1-x-y}N$ of another composition (satisfying the condition of zero net polarization charge at the interface between 12a and 12b) between 3 and 1000 nm thick, and may be doped with Si, Ge or any other n-type dopant with a concentration between $5\times 10^{17}$ and $2\times 10^{19}$ cm$^{-3}$. In one example, first layer 12a grown on a ScAlMgO$_4$ substrate is a 500 nm thick $In_{0.14}Ga_{0.86}N$ layer and second layer 12b is a 30 nm thick layer of $Al_xIn_yGa_{1-x-y}N$ where the composition satisfies the relationship $x=2*y-0.28$ for $0.14\le y\le 0.32$, such as $Al_{0.06}In_{0.17}Ga_{0.77}N$. The stack of layers 12a and 12b may be repeated; for example, there may be up to 50 pairs of layers 12a and 12b.

In the structure illustrated in FIG. 3, base region 12 is formed from polarized materials, such as wurtzite BAlGaInN. Base region 12 includes at least two layers, a first layer 12c with a first polarization, and a second layer 12d with a different polarization. Band-bending due to polarization may induce a 2DEG at the interface between layers 12c and 12d. Layers 12c and 12d may each have thicknesses between 2 and 1000 nm, and may be each doped with an n-type dopant such as Si with a concentration of $5\times 10^{16}$ to $5\times 10^{19}$ cm$^{-3}$. In some embodiments, one of the first and second layers 12c and 12d is strained. For example, in a device grown on a ScAlMgO$_4$ substrate, the first layer 12c may be $In_{0.136}Ga_{0.864}N$, and the second layer 12d may be GaN or $In_yGa_{1-y}N$ with y<0.13 In some embodiments, first and second layers 12c and 12d are both lattice matched to the substrate. For example, in a device grown on a ScAlMgO$_4$ substrate, the first layer 12c may be $In_{0.136}Ga_{0.864}N$ and the second layer 12d may be $Al_{0.5}In_{0.25}Ga_{0.25}N$ or another lattice-matched quaternary layer $Al_xIn_yGa_{1-x-y}N$ where $y=0.136+0.228*x$ and $x+y\le 1$. In another example, in a device grown on a ScAlMgO$_4$ first layer 12c may be $In_{0.136}Ga_{0.864}N$ or any other layer that is lattice-matched to the substrate and second layer 12d may be $Al_{0.71}In_{0.29}N$. In the examples described above, each of the first and second layers 12c and 12d may be between 3 nm and 200 nm thick. These layers may be doped with Si or Ge (or any n-type dopant) between $1\times 10^{17}$ cm$^{-3}$ to $2\times 10^{19}$ cm$^{-3}$ or not intentionally doped. The stack of layers 12c and 12d may be repeated; for example, there may be up to 50 pairs of layers 12c and 12d.

The base region structures illustrated in FIGS. 2 and 3 may be combined, and/or repeated throughout the base region 12. The lateral conduction-enhancing base regions illustrated in FIGS. 2 and 3 may also reduce risk of device damage from electrostatic discharge.

In the structure illustrated in FIG. 4, the base region 12 is graded in composition to induce a bulk charge from changing polarization (this is referred to as polarization doping), which may improve lateral conduction in the base region. For example, grading along the (0001) direction from a region 12e of, for example, GaN close to the substrate 10 to a region 12f of, for example, AlGaN close to the device structure may induce a fixed positive charge due to the gradient in polarization, which may attract electrons to achieve charge neutrality. For growth on a ScMgAlO$_4$ substrate 10, the composition may be graded using compounds of BAlGaInN to achieve lattice matching, using the gradient in spontaneous polarization to spread out the 2DEG formed at abrupt polar junctions (for example, at the interface between two layers of different composition) and to achieve electrical conductivity in the graded region. A graded base region may be between 10 and 500 nm thick in some embodiments and 100 nm thick in some embodiments. In one example, in a device grown on a ScAlMgO$_4$ substrate, the graded base region is In$_y$Ga$_{1-y}$N, graded from an indium composition y of 0.16 in the region closest to substrate 10 (region 12e) to 0.11 in the region closest to the device structure (region 12f). In an InGaN graded region, the beginning and ending indium compositions may be differ by as much as 0.16 and as little as 0.01, with ending compositions of InGaN (i.e. the composition in region 12f) between 0.12 and 0.0. In another example, the graded region is lattice-matched to a ScAlMgO$_4$ substrate. A lattice-matched graded region may be between 5 and 1000 nm thick in some embodiments and between 10 and 50 nm thick in some embodiments. The composition of a lattice-matched graded region grown on a ScAlMgO$_4$ substrate may vary for example from In$_{0.13}$Ga$_{0.87}$N in region 12e to In$_{0.3}$Al$_{0.7}$N in region 12f. The composition in region 12e may be quaternary Al$_x$In$_y$Ga$_{1-x-y}$N with an indium composition y between 0.13 and 0.18 and an aluminum composition selected to maintain the lattice match according to the equation y=0.136+0.228*x, as described above.

Figure 5:
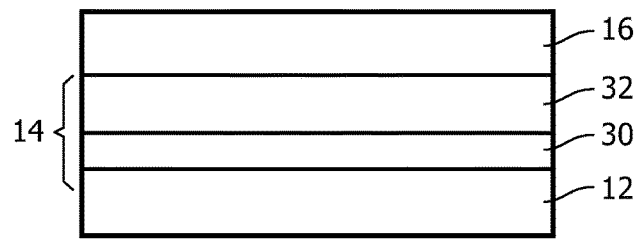
FIGS. 5 and 6 illustrate portions of a III-nitride device structure.

FIG. 5 illustrates several layers on the n-type side of active region 16. In the structure illustrated in FIG. 5, the n-type region 14 includes a portion of base region 12, an optional smoothing layer 30, and an optional spacer layer 32.

In the structure illustrated in FIG. 5, an optional smoothing layer 30 is disposed between the base region 12 and the active region 16. The characteristics of smoothing layer 30 be selected to enhance the morphology or surface characteristics of layers grown over the smoothing layers. Smoothing layer 30 may have, for example, a thickness between 1 nm and 10 µm and may be, for example, InGaN of lower InN composition than the light-emitting layers to avoid absorption (or, alternatively, BAlGaInN with a larger band gap than the light-emitting layers). In some embodiments, smoothing layer 30 may be composed of any BAlGaInN compound with the composition chosen to be lattice matched to a light emitting layer in the active region 16, though it may be strained in cases where the composition of the strained layer provides benefits to device performance in terms of leakage, forward voltage, reliability and quantum efficiency over that of an unstrained layer. In some embodiments, smoothing layer 30 may not be lattice-matched to the base region 12 and may produce basal plane faults that relieve strain such that the layers grown over the smoothing layer 30 are no longer matched to the base region 12. The smoothing layer is often doped with the same type of carriers as the base region 12. The carrier concentration in the smoothing layer achieved through doping and/or polarization doping is between $1\times10^{16}$ and $1\times10^{21}$ cm$^{-3}$ in some embodiments.

Also in the structure illustrated in FIG. 5, an optional spacer layer 32 is disposed between base region 12 and active region 16. Optional spacer layer 32 may be disposed between the smoothing layer 30 and active region 16, when a smoothing layer is included in the device. Spacer layer 32 is a BAlGaInN layer with a smaller or larger band gap than the base region, but a larger band gap than the light-emitting layers. Spacer layer 32 may have a thickness between 1 nm and 10 µm in some embodiments and between 5 and 50 nm in some embodiments. The characteristics of spacer layer 32 may be selected to balance strain in the light-emitting layers of the active region and other layers in the structure to reduce defects or engineer band structure, may be strained to achieve the best material quality possible, or lattice matched to reduce the overall strain in the layer stack. Spacer layer 32 may have a different carrier concentration from surrounding layers, caused by different dopant concentrations, composition gradients in the spacer, or depletion of carriers due to surrounding heterostructures. The band gap of the spacer layer material may be chosen in concert with the morphology to optimize carrier injection into the light-emitting layers. For example, a large band gap material may be used to reduce hole leakage and/or improve carrier confinement in the light-emitting layers. In some embodiments, spacer layer 32 may be strained GaN or In$_y$Ga$_{1-y}$N, where the indium composition y is between 0 and y$_{LEL}$−0.08, where y$_{LEL}$ is the indium composition of an In$_y$Ga$_{1-y}$N light emitting layer. For example, y$_{LEL}$ is about 0.15 for an emission wavelength of 450 nm, so the indium composition of an InGaN spacer layer in such a device may be between 0 and 0.07. Increasing indium composition in an InGaN spacer layer may provide improved injection compared to a GaN spacer, due to reduced polarization charge at the spacer/ active layer interface. However, increasing the indium composition in the spacer layer may also reduce the confinement of carriers in the active region by reducing the band gap of the spacer layer. In some embodiments, spacer layer 32 may be a quaternary Al$_x$In$_y$Ga$_{1-x-y}$N layer that is strained or lattice-matched to the substrate. In embodiments where the spacer layer is strained, the composition may be selected such that the strain offsets strain in other layers of the device. In some embodiments, the composition of an AlInGaN spacer layer is selected to provide a large enough band gap to confine the carriers and to improve carrier injection by reducing polarization charge, as compared to a GaN or InGaN spacer. For example, in a device with an In$_y$Ga$_{1-y}$N light emitting layer with an indium composition y$_{LEL}$ of 0.14, the following compositions in a spacer layer Al$_x$In$_y$Ga$_{1-x-y}$N may reduce polarization compared to a GaN spacer layer, and also provide adequate carrier confinement: for y=0.04, x=0.0-0.04; for y=0.08, x=0.0-0.08; for y=0.12, x=0.04-0.10; for y=0.16, x=0.14-0.18; for y=0.20, x=0.20-0.24; for y=0.24, x=0.26-0.30; and for y=0.30, x=0.32-0.42.

All or a portion of spacer layer 32 may be intentionally graded to achieve desired carrier concentrations through polarization doping, and/or to enhance carrier injection into the light-emitting layers. For example, in some embodiments, the AlN and InN composition in spacer layer 32 may be decreased (if lattice-matched), or the InN composition may be increased (if not lattice-matched), from the light-emitting region 16 to the interface with the smoothing layer 30. When doped with an n-type dopant to a density between $1 \times 10^{16}$ and $1 \times 10^{21}$ cm$^{-3}$, band bending in the valence band that opposes hole motion away from the light emitting layers may improve carrier confinement in the light emitting region 16. The same gradient may also be used to oppose electron motion if the layer is doped with a p-type dopant such as Mg or Zn to the same concentrations. A graded spacer layer may be between 3 nm and 50 nm thick in some embodiments. In one example, in a device grown on a ScAlMgO$_4$ substrate, spacer layer 32 be a 6 nm thick In$_y$Ga$_{1-y}$N layer graded linearly from an indium composition y of 0.1 near smoothing layer 30 to an indium composition of 0.05 near light emitting region 16. In another example, in a device grown on a ScAlMgO$_4$ substrate, spacer layer 32 is lattice matched to the substrate and is a 20 nm thick layer graded from In$_{0.1}$Ga$_{0.86}$N near smoothing layer 30 to Al$_{0.35}$In$_{0.22}$Ga$_{0.43}$N near light emitting region 16. The portion of the spacer layer near the light emitting region may have an aluminum composition x between 0.05 to 0.6 and an indium composition selected such that the material is lattice matched to the substrate, as described above. The portion of the spacer layer near the smoothing layer may have an aluminum composition x less than 0.1 and an indium composition selected such that the material is lattice matched to the substrate, as described above. In another example, in a device grown on a ScAlMgO$_4$ substrate, the spacer layer may be an In$_y$Ga$_{1-y}$N layer, at least partially strained, between 3 nm and 40 nm thick, graded from In$_{0.16}$Ga$_{0.84}$N near the smoothing layer to In$_{0.1}$G$_{0.9}$N near the light emitting region. The portion of the spacer layer near the smoothing layer may have an indium composition y between 0.18 and 0.15 and the portion of the spacer layer near the light emitting region may have an indium composition y between 0.14 and 0.

Returning to FIG. 1, the light emitting region 16 may be, for example, a multi quantum well (QW) structure or a double heterostructure (DH). In both types of light emitting regions, the light emitting layers are BAlGaInN. In some embodiments, the light emitting layers are between 0.5 nm and 5 μm thick. Quantum wells are often less than 3 nm thick. The light emitting layers in double heterostructures are often between 3 nm and 3 μm thick. Thicker light emitting layers are preferred in some embodiments to improve performance at high current density. In some embodiments, quantum wells are thicker than 3 nm. In some embodiments, the light emitting layer in a DH is thicker than 100 nm. The total thickness of the light emitting region is at least 30 nm thick in some embodiments, at least 50 nm thick in some embodiments, at least 75 nm thick in some embodiments, at least 100 nm thick in some embodiments, at least 200 nm thick in some embodiments, at least 500 nm thick in some embodiments, at least 1 μm thick in some embodiments, at least 2 μm thick in some embodiments, at least 3 μm thick in some embodiments, and at least 5 μm thick in some embodiments.

The light emitting layers of the light emitting region 16 may be lattice matched or nearly lattice matched to the substrate 10, base region 12, or smoothing layer 30. At emission wavelengths between 430 and 470 nm, the InN composition in the light emitting layers in some embodiments may be greater than the composition in light emitting layers in conventionally-grown structures, due to the larger lattice constant during growth, and the amount of strain in the light emitting layer may change the emission wavelength. Since the light emitting layer is less strained than a light emitting layer in a conventional device, more indium may be incorporated during growth at a given temperature. Accordingly, a light emitting layer with a desired indium composition may be grown at a higher temperature as compared to the same light emitting layer in a conventional device. Higher growth temperatures of the light emitting layers in devices grown on the substrates described herein may improve material quality through reduction of point and extended defects in the light emitting region, which may improve quantum efficiency. Since the amount of strain in the light emitting layers in some embodiments is less than the strain in conventionally grown light emitting layers that emit at the same wavelength, the light emitting layers in some embodiments may be grown thicker than conventionally grown light emitting layers. Typical problems with thick strained layers such as basal plane stacking faults, In-metal-void complexes, and precipitation of inclusions are avoided or reduced in some embodiments. Thicker light emitting layers reduce the carrier concentration in the light emitting layer, which may increase quantum efficiency at high current densities by reducing Auger non-radiative recombination.

In devices with multiple light emitting layers, such as multi-quantum well devices, the light emitting layers are separated by barrier layers of strained or unstrained BAlIn-GaN. In some embodiments, the barriers are Al$_{0.05}$In$_{0.15}$Ga$_{0.80}$N, or any other Al composition that satisfies the above equation for lattice-matched layers grown on ScAlMgO$_4$ substrates. Lower Al composition layers may be used in between light-emitting layers to enhance carrier transport, and higher Al composition may be used to slow transport. In some embodiments, the barriers are strained but Al-free. The band gap in the barriers is greater than the band gap in the light emitting layers. The barriers may be between 0.5 nm and 1 μm thick in some embodiments, between 2 nm and 50 nm thick in some embodiments, and between 2 nm and 10 nm thick in some embodiments. The barriers may be not intentionally doped or intentionally doped with an n- or p-type dopants to dopant concentrations between $1 \times 10^{15}$ and $1 \times 10^{20}$ cm$^{-3}$. The barriers may have a constant or graded composition. In some embodiments, the barrier layer or layers may be strained GaN or In$_y$Ga$_{1-y}$N, where the indium composition y is between 0 and y$_{LEL}$−0.08, where y$_{LEL}$ is the indium composition of an In$_y$Ga$_{1-y}$N light emitting layer. For example, y$_{LEL}$ is about 0.15 for an emission wavelength of 450 nm, so the indium composition y of an In$_y$Ga$_{1-y}$N barrier layer in such a device may be between 0 and 0.07. In some embodiments, the barrier layer or layers may be quaternary AlInGaN layers that are strained or lattice-matched to the substrate. In embodiments where the barrier layers are strained, the composition may be selected such that the strain offsets strain in other layers of the device. In some embodiments, the composition of an AlInGaN barrier layer is selected to provide a large enough band gap to confine the carriers and to improve carrier injection by reducing polarization charge, as compared to a GaN or InGaN barrier layer. For example, in a device with an In$_y$Ga$_{1-y}$N light emitting layer with an indium composition y$_{LEL}$ of 0.14, the following compositions in a barrier layer Al$_x$In$_y$Ga$_{1-x-y}$N may reduce polarization compared to a GaN barrier layer, and also provide adequate carrier confinement: for y=0.04, x=0.0-0.04; for y=0.08, x=0.0-0.08; for y=0.12, x=0.04-0.10; for y=0.16, x=0.14-0.18; for y=0.20, x=0.20-0.24; for y=0.24, x=0.26-0.30; and for y=0.30, x=0.32-0.42.

In some embodiments, the active region is a multi-quantum well active region composed of wells and barriers of uniform composition. The composition of the well and barrier layers are selected such that the compressive strain in InGaN quantum well layers is at least partially countered by tensile strain in the barriers. For a device grown on a ScAlMgO$_4$ substrate, a lattice-matched In$_y$Ga$_{1-y}$N layer has indium composition y of 0.136. If the wells have y=0.18, the wells are under ~0.45% compressive strain. Barrier layers with quaternary compositions that lie between Al$_{0.74}$In$_{0.26}$N and In$_{0.10}$Ga$_{0.90}$N will result in barriers with larger bandgaps than the wells (providing carrier confinement), but which have the opposite strain state (i.e. ~0.45% tensile strain). If the barriers and wells are of equal thickness and are in strain states of equal magnitude but opposite sign, the net strain may be canceled. If the barriers are under tensile strain of smaller magnitude than the compressive strain in the well, the barrier layers may be grown thicker than the well for the net strain energy to be zero. The strain energy is often proportional to the product of the layer thickness and the layer strain, so a spacer twice as thick as a well would only need to be under a tensile strain of half the magnitude of the well in order to result in a net strain energy of zero.

In one example, a device grown on a ScAlMgO$_4$ substrate includes a lattice-matched In$_{0.136}$Ga$_{0.864}$N n-type layer. A multiple quantum well light emitting region grown over the n-type layer includes at least two In$_y$Ga$_{1-y}$N wells separated by at least one barrier layer. The wells and barrier layers are of equal thickness. For a device with a net strain energy in the light emitting region of zero, the barrier layers consist of a single quaternary composition which obeys one of the relationships listed below, where r can vary from 0 to 1. For y=0.15 in the wells, the barrier layers are (Al$_{0.715}$In$_{0.285}$N)$_r$(In$_{0.12}$Ga$_{0.88}$N)$_{1-r}$; for y=0.16, the barriers are (Al$_{0.725}$In$_{0.275}$N)$_r$(In$_{0.12}$Ga$_{0.88}$N)$_{1-r}$; for y=0.18, the barriers are (Al$_{0.74}$In$_{0.26}$N)$_r$(In$_{0.10}$Ga$_{0.90}$N)$_{1-r}$; for y=0.2, the barriers are (Al$_{0.765}$In$_{0.235}$N)$_r$(In$_{0.08}$Ga$_{0.92}$N)$_{1-r}$; for y=0.25, the barriers are (Al$_{0.795}$In$_{0.206}$N)$_r$(In$_{0.03}$Ga$_{0.97}$N)$_{1-r}$; for y=0.28, the barriers are (Al$_{0.82}$In$_{0.18}$N)$_r$(GaN)$_{1-r}$. In a multi-quantum well structure where the well composition is different for every well, the composition in the barrier adjacent to each well is chosen according to the relationships described above to balance the compressive strain in each well.

In another example, a device grown on a ScAlMgO$_4$ substrate includes a lattice-matched In$_{0.136}$Ga$_{0.864}$N n-type layer. A double-heterostructure grown on the n-type layer includes a spacer layer disposed on the n-type layer and a single 10 nm thick In$_{0.18}$Ga$_{0.88}$N light emitting layer disposed on the spacer. The spacer layer, in order to balance the compressive strain in the well, may be 10 nm of (Al$_{0.74}$In$_{0.26}$N)$_r$(In$_{0.10}$Ga$_{0.90}$N)$_{1-r}$ or 20 nm of (Al$_{0.725}$In$_{0.275}$N)$_r$(In$_{0.12}$Ga$_{0.98}$N)$_{1-r}$ where r is between zero and one.

In another example, a device grown on a ScAlMgO$_4$ substrate includes a lattice matched n-type layer of any composition of (Al$_{0.71}$In$_{0.29}$N)$_r$(In$_{0.136}$Ga$_{0.864}$N)$_{1-r}$ (with r between 0.226 and 1). A double-heterostructure grown on the n-type layer includes a spacer layer disposed on the n-type layer and a single 10 nm thick In$_{0.18}$Ga$_{0.82}$N light emitting layer disposed on the spacer. The spacer layer, in order to balance the compressive strain in the light emitting layer, may be 2.9 nm of GaN, 10 nm of (Al$_{0.74}$In$_{0.26}$N)$_r$(In$_{0.10}$Ga$_{0.90}$N)$_{1-r}$, 20 nm of (Al$_{0.725}$In$_{0.275}$N)$_r$(In$_{0.12}$Ga$_{0.98}$N)$_{1-r}$ (r is between 0 and 0.152), or 40 nm of (Al$_{0.715}$In$_{0.285}$N)$_r$(In$_{0.12}$Ga$_{0.88}$N)$_{1-r}$ r (r is between 0 and 0.188).

In some embodiments, the composition or doping in one or more light emitting layers is graded. The entire thickness of a light emitting layer may be graded, or grading may be localized to one or both ends of the light emitting layer.

Figure 6:
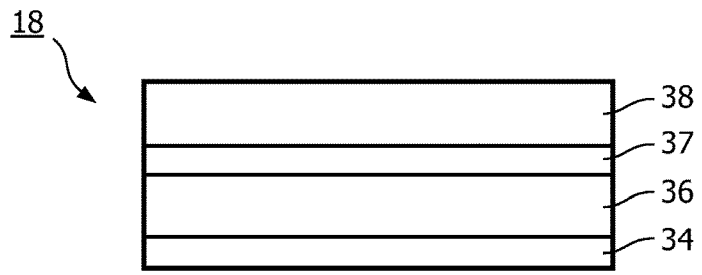

FIG. 6 illustrates one example of a p-type region 18. In the structure illustrated in FIG. 6, an optional cap layer 34 is grown first on active region 16 (active region 16 is shown in FIG. 1), followed by an optional electron blocking layer 36, followed one or more layers 37 for lateral conduction, vertical conduction, and extraction, followed by a p-contact layer 38. The thickness of p-type region 18 may be chosen to maximize light extraction, which may be influenced by cavity effects caused by the spacing of active region 16 from a reflective p-contact.

In some embodiments, cap layer 34 is the same composition as the barrier layers in the active region. In some embodiments, cap layer 34 is a different composition from the barrier layers, to control electric fields, strain and/or transport properties. In some embodiments, cap layer 34 is grown under pit-filling conditions to achieve a planar surface and prevent dopant diffusion into the light-emitting layers. For example, cap layer 34 may be grown using V/III ratios greater than 10, pressures lower than 700 mbar, N$_2$ or H$_2$ ambient environments and temperatures between 800° C. and 1100° C. in MOCVD growth using TMIn, TEGa and/or TMGa as the group-III precursors for InGaN. Such pit-filling conditions may be used anywhere in the device structure where pits are detrimental to device performance. Cap layer 34 may be 0.5 nm to 500 nm thick and not intentionally doped, though n-type dopants such as Si or p-type dopants such as Mg or Zn may be included to control the electrical junction's properties. The cap layer may be graded or stepped in composition to influence high temperature performance, forward voltage V$_f$ or leakage current. The portion of cap layer 34 to the p-contact layer may be doped p-type intentionally during growth, or through diffusive processes from neighboring layers.

An optional electron blocking layer 36 is formed over the cap layer 34 if present, or over active region 16 if no cap layer is included in the device. Electron blocking layer 36 has a larger band-gap than the light emitting layers. In some embodiments, electron blocking layer 36 is In$_{0.14}$Ga$_{0.86}$N, which is lattice matched to ScAlMgO$_4$, InGaN with a smaller InN composition, which is strained when grown on ScAlMgO$_4$, GaN, Al$_x$Ga$_{1-x}$N, where x<0.4, a quaternary layer that is strained or lattice matched when grown on ScAlMgO$_4$, or a quaternary Al$_x$In$_y$Ga$_{1-x-y}$N that is lattice matched when grown on ScAlMgO$_4$ with an indium composition y between 0.05 and 0.3. Electron blocking layer 36 may have a thickness between 0.5 nm and 1 µm in some embodiments, between 2 nm and 100 nm in some embodiments, between 3 nm and 40 nm in some embodiments, and 20 nm in some embodiments. In some embodiments, polarization in the cap and electron blocking layers is matched by appropriately selecting the composition of each layer. For example, in a device grown on a ScAlMgO$_4$ substrate, the cap layer may be In$_{0.14}$Ga$_{0.86}$N and the polarization-matched electron blocking layer may be In$_{0.3}$Al$_{0.32}$Ga$_{0.38}$N between 2 and 40 nm thick in some embodiments and between 5 and 20 nm thick in some embodiments. The electron blocking layer may be any composition that meet the polarization-matching criterion described above, with an indium composition y between 0.17 and 0.4 in some embodiments. Electron blocking layer 36 may be doped with the p-type dopant Mg to dopant concentrations between $1\times10^{16}$ cm$^{-3}$ and $1\times10^{21}$ cm$^{-3}$ in some embodiments and between $5\times10^{18}$ cm$^{-3}$ and $2\times10^{20}$ cm$^{-3}$ in some embodiments. Any p-type dopant may be used or the electron blocking layer may be not intentionally doped. In some embodiments, the composition of electron blocking layer 36 is stepped or graded.

One or more optional p-type layers 37 for lateral conduction, vertical conduction and extraction efficiency are formed before p-contact layer 38. In some embodiments, a single 1 nm to 10 µm thick layer 37 is intentionally doped with a p-type dopant to a concentration between $1\times10^{15}$ and $1\times10^{21}$ cm$^{-3}$. In some embodiments, layer 37 is In$_{0.14}$Ga$_{0.86}$N, which is lattice-matched when grown on ScAlMgO$_4$, any of the quaternary compounds that satisfy the above equation for lattice-matching to ScAlMgO$_4$, or Al$_{0.70}$In$_{0.30}$N. In some embodiments, layer 37 is strained, with a lattice mismatch of less than 15%. Examples of suitable materials include GaN, InGaN, AlInGaN or AlInN.

The last p-type layer is p-contact layer 38, the composition, thickness, and doping of which are selected such that p-contact layer 38 is minimally absorbing of the light emitted by the light emitting layers, forms an ohmic contact with the p-metallization, and has sufficient vertical conductivity for device operation. In some embodiments, p-contact layer 38 is highly-doped GaN or InGaN with an InN composition less than 40%. In some embodiments, p-contact layer 38 is between 1 nm and 10 µm thick and doped with any suitable p-type dopant such as Mg or Zn to concentrations between $1\times10^{16}$ and $1\times10^{22}$ cm$^{-3}$.

In some embodiments, a top surface of p-type region 18 is roughened or textured and light is extracted from the device through the top surface of the p-type region.

Figure 9:
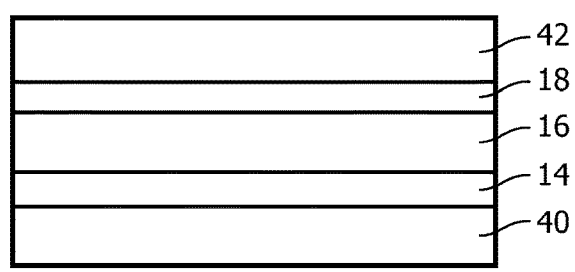
FIG. 9 illustrates a portion of a III-nitride structure including at least one distributed Bragg reflector.

FIG. 9 illustrates a portion of a device including at least one distributed Bragg reflector (DBR). In devices grown on ScMgAlO$_4$, Al$_{0.71}$In$_{0.29}$N and In$_{0.14}$Ga$_{0.86}$N layers have no strain and a sufficiently large difference in index of refraction to form a DBR. In some embodiments, the DBR is formed from 1 to 200 alternating layers of Al$_{0.71}$In$_{0.29}$N and In$_{0.1}$Ga$_{0.86}$N with thicknesses between 10 nm and 10 µm. The DBR layers may be doped with Si, Mg, Zn or any other suitable p- or n-type dopant if electrical conductivity is necessary or desired. The DBR may be used as a high-quality reflector, or band-blocking filter. Two DBRs 40 and 42 are illustrated in FIG. 9, one on the n-side of active region 16 and one on the p-side of active region 16. The placement of the DBR in an epitaxial structure depends on its function. In some embodiments, a single DBR is disposed on the p-side, such as DBR 42 in FIG. 9, and tuned to form an optical cavity with the light emitting layers in order to increase extraction efficiency in place of or in addition to an external metallic mirror. In some embodiments, a single DBR is disposed on the n-side, such as DBR 40 in FIG. 9, with the same goal of increased extraction efficiency. The spacing between the DBR and the light emitting layers in both cases may be between 1 nm to 10 µm, depending on the optical phase shift in the DBR stack. In some embodiments, DBRs are placed on both sides of the active region 16, as illustrated in FIG. 9. Depending on the transmission of the DBRs, such a structure may be used in side-emitting LDs (high reflectance), micro-cavity LEDs (high-reflectance on one side of light-emitting layers) or vertical cavity LDs (high-reflectance on both sides of the light-emitting layers). In some embodiments, DBR 40 or 42 is backed by a highly reflective metal layer, in order to improve reflectivity. DBR 40 or 42, or a layered reflector having improved reflectivity as a function of incidence angle, or an omnidirectional reflector (ODR) may be grown, deposited, or bonded to the device structure. An ODR may have dielectric, metal, transparent conductive oxide, or semiconductor layers, or a combination of layers. An ODR may or may not be conductive. For example, an ODR may be formed from alternating SiO$_2$ layers with a thickness of 70 to 80 nm each and TiO$_2$ layers with a thickness of 50 to 60 nm each depending on wavelength. Other dielectrics such as, for example, SiN, MgO$_x$, MgN$_x$, ZnO, SiO$_x$, and SiN$_x$ may be used. Suitable reflective metals include Ag and Al.

Light-confining layers besides DBRs may be formed in the device in some embodiments. Examples of light-confining layers include layers of either higher or lower refractive index, which may modify the distribution of optical modes within the structure. For example, in a laser diode, layers of low or high index can be used to form a waveguide or to enhance waveguiding. In a light-emitting diode, low or high index layers may be used to modify the distribution of guided modes to enhance coupling to light-extracting features such as surface roughness or a photonic crystal. In some embodiments, the thickness of these light-confining layers is on the order of an optical wavelength λ, for example between 0.1λ/n and 10λ/n, where n is the index of refraction of the light-confining layer.

Figure 7:
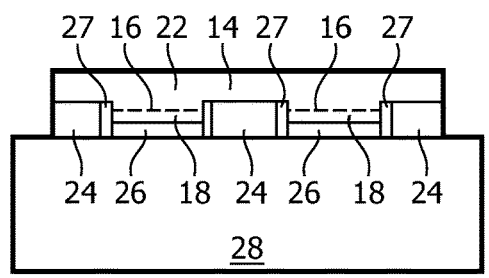
FIG. 7 illustrates a thin film flip chip light emitting device.
Figure 8:
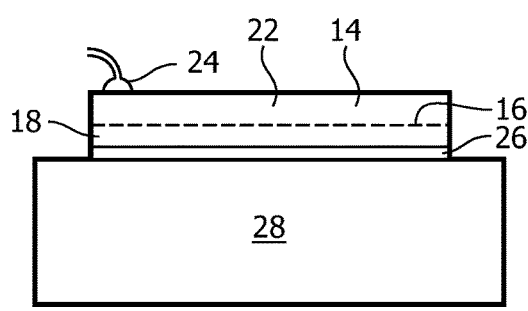
FIG. 8 illustrates a vertical injection light emitting device.

The semiconductor structures described above may be incorporated into any suitable device design, including, for example, the thin film flip chip device illustrated in FIG. 7 and the vertical current injection device illustrated in FIG. 8. The semiconductor structures 22 shown in FIGS. 7 and 8 are grown on a growth substrate 10 as described above, and may be or may include any of the semiconductor structures shown in FIGS. 1, 2, 3, 4, 5, 6, and 9 and described above. Different features from different figures or from the above description may be combined.

In the device illustrated in FIG. 7, p-contact metal 26 is disposed on the p-type region, then portions of the p-type region and active region are etched away to expose an n-type layer for metallization. The p-contacts 26 and n-contacts 24 are on the same side of the device. P-contacts 26 are electrically isolated from n-contacts 24 by gaps 27, which may be filled with an electrically insulating material such as a dielectric. As illustrated in FIG. 7, p-contacts 26 be disposed between multiple n-contact regions 24, though this is not necessary. In some embodiments either or both the n-contact 24 and the p-contact 26 are reflective and the device is mounted such that light is extracted through the top of the device in the orientation illustrated in FIG. 7. In some embodiments, the contacts may be limited in extent or made transparent, and the device may be mounted such that light is extracted through the surface on which the contacts are formed. The semiconductor structure is attached to a mount 28. All or part of the substrate on which semiconductor structure 22 is grown may be removed, as illustrated, or may remain part of the device. In some embodiments, the semiconductor layer exposed by removing all or part of the growth substrate is patterned or roughened, which may improve light extraction from the device.

In some embodiments, an optional zone of weakness is provided at or near the interface of semiconductor structure 22 and the growth substrate in order to encourage the fracture of that interface and thereby make it easier to remove the semiconductor film from the growth substrate. A zone of weakness may be formed prior to or after deposition of all or part of the semiconductor structure. A zone of weakness may be provided in the growth substrate or semiconductor structure by implantation one or more of H or N, alone or in combination with other ions, in sufficient concentration such that, upon application of heat, the ions will form microcavities. For example, H may be implanted with a dose of $10^{17}$ cm$^{-2}$ with an accelerating voltage of 120 keV.

A zone of weakness in semiconductor structure 22 may be provided by growing the portion of semiconductor structure 22 nearest the growth substrate first with a higher mole fraction of InN (at a certain growth temperature) and subsequently with a lower mole fraction of InN (preferentially at a composition that is lattice matched to the substrate, at a certain higher growth temperature). The higher-InN-bearing semiconductor layer may transform at the higher growth temperature according to its phase diagram into regions of even higher and lower indium composition. The regions of highest indium composition are more absorbent of incident laser light, and the mechanical stress due to the spatially varying indium composition will create a layer of mechanical weakness in the alloy film.

In some embodiments, a zone of weakness is formed by exposing the wafer with a pattern of tightly focused, pulsed laser beams of sufficient intensity and photon energy to create a plurality of micron-scale crystal defects or voids in the crystalline structure. The pattern of crystal damage may be generated by rastering one or more laser beams across the wafer or the use of diffractive optics to generate a large number of spots from a single high power laser such as an excimer laser. The laser beams may be strongly converging with a short sub-microsecond pulse, and may create highly localized damage.

All or part of the growth substrate is removed by any suitable method. In structures including a zone of weakness, the growth substrate may be removed at the zone of weakness, for example by heating to activate the implanted layer described above. In some embodiments, a structure including a zone of weakness of implanted H atoms is heated to a temperature of 600° C. (the temperature may be higher or lower, depending on the implant species and dose), whereupon the H atoms collect into microcavities which cause the zone of weakness to mechanically fracture. An advantage of providing a zone of weakness to remove the growth substrate from semiconductor structure 22 is that the remaining portion of the growth substrate may be polished and used again as a growth substrate.

Other methods of removing the growth substrate include mechanical methods such as mechanical grinding, applying a rotational force between the growth substrate and the semiconductor structure, attaching an adhesive-coated plastic film to the growth substrate and a second adhesive-coated plastic film to the semiconductor structure and pulling the growth substrate and semiconductor structure apart, using a sharp blade to break the interface between the growth substrate and the semiconductor structure, using a pulse of sonic energy or inhomogeneous temperature distribution to break the interface between the growth substrate and the semiconductor structure, applying one or more laser pulses focused to a small point (<1 mm$^2$) at the interfacial plane creating a shockwave that initiates fracture, and applying a temperature gradient across the surface normal of the semiconductor and growth substrate (for example, higher temperature applied to one face of the semiconductor structure, and lower temperature applied to one face of the growth substrate), such that the thermally induced stress in the plane of the semiconductor structure/growth substrate interface is sufficient to cause fracture of that interface.

In some embodiments, the growth substrate is transparent, allowing the growth substrate to be removed from semiconductor structure 22 by laser lift-off, where a laser beam is directed through the growth substrate. The layer of III-nitride material grown first on the growth substrate absorbs the laser light and melts, releasing semiconductor structure 22 from the growth substrate. Laser lift-off may be facilitated by an optional layer of narrower-energy-gap alloy semiconductor disposed proximate the growth substrate. The composition of the narrower-energy-gap layer may be selected such that it absorbs more of the incident laser light than the adjacent semiconductor layer, which may reduce the incident flux required and producing less distributed damage throughout the semiconductor structure 22.

In some embodiments, all or a part of the growth substrate, such as a portion of the growth substrate remaining after activating an implanted layer to detach the growth substrate from the semiconductor structure, is removed by etching, such as wet chemical etching. For example, ScMgAlO$_4$ is readily attacked by aqueous mixtures of H$_3$PO$_4$ and H$_2$O$_2$, H$_2$SO$_4$:H$_2$O$_2$:H$_2$O, and aqueous mixtures of HF, as reported by C. D. Brandle, et al. in "Dry and Wet Etching of ScMgAlO$_4$" published in Solid-State Electronics, 42, 467 (1998), which is incorporated herein by reference. In some embodiments, all or part of the growth substrate is removed by reactive ion etching using a gaseous mixture of Cl$_2$ and Ar at an applied power of 800 Watts.

Once the growth substrate is removed, it may be re-surfaced and used again.

In the vertical injection LED illustrated in FIG. 8, an n-contact is formed on one side of the semiconductor structure 22, and a p-contact is formed on the other side of the semiconductor structure. For example, the p-contact 26 may be formed on the p-type region and the device may be attached to mount 28 through p-contact 26. All or a portion of the growth substrate may be removed and an n-contact 24 may be formed on a surface of the n-type region exposed by removing all or a portion of the substrate. Electrical contact to the n-contact may be made with a wire bond as illustrated in FIG. 8 or a metal bridge.

The LED may be combined with one or more wavelength converting materials such as phosphors, quantum dots, or dyes to create white light or monochromatic light of other colors. All or only a portion of the light emitted by the LED may be converted by the wavelength converting materials. Unconverted light emitted by the LED may be part of the final spectrum of light, though it need not be. Examples of common combinations include a blue-emitting LED combined with a yellow-emitting phosphor, a blue-emitting LED combined with green- and red-emitting phosphors, a UV-emitting LED combined with blue- and yellow-emitting phosphors, and a UV-emitting LED combined with blue-, green-, and red-emitting phosphors. Wavelength converting materials emitting other colors of light may be added to tailor the spectrum of light emitted from the device.

The wavelength converting element may be, for example, a pre-formed ceramic phosphor layers that is glued or bonded to the LED or spaced apart from the LED, or a powder phosphor or quantum dots disposed in an organic or inorganic encapsulant that is stenciled, screen printed, sprayed, sedimented, evaporated, sputtered, or otherwise dispensed or deposited over the LED.

Example 1

An Al-free LED grown on a ScAlMgO$_4$ substrate includes a 1-6 μm thick In$_{0.14}$Ga$_{0.86}$N base layer 12 doped with $1\times10^{18}$ to $1\times10^{19}$ cm$^{-3}$ Si, followed by an active region 16 including In$_{0.15-0.20}$Ga$_{0.85-0.8}$N quantum wells of 2-5 nm thickness separated by barriers composed of In$_{0.10-0.16}$Ga$_{0.9-0.84}$N with 1-6 nm thickness, all nominally un-doped. Active region 16 is followed by a 2-10 nm thick In$_{0.10-0.16}$Ga$_{0.9-0.84}$N cap layer 34, a 10-40 nm thick In$_{0.0-0.13}$Ga$_{1-0.87}$N electron blocking layer 36 doped with Mg to $1\times10^{20}$ cm$^{-3}$, and a 60-120 nm thick In$_{0.14}$Ga$_{0.86}$N p-contact layer 38 doped with Mg at a concentration of $1\times10^{18}$ to $1\times10^{19}$ cm$^{-3}$ for the first 85 nm, then ramped to $5\times10^{19}$ to $2\times10^{20}$ cm$^{-3}$ for the final 1-10 nm.

Example 2

An Al-free LED including a pit-filling layer is grown on a ScAlMgO$_4$ substrate. A 1-6 µm thick In$_{0.14}$Ga$_{0.86}$N base layer 12 is doped with $1\times10^{18}$ to $1\times10^{19}$ cm$^{-3}$ Si, followed by a 1-20 nm thick pit-filling layer composed of In$_{0.0-0.13}$Ga$_{1-0.87}$N doped similarly to the base layer. The active region 16 includes In$_{0.15-0.20}$Ga$_{0.85-0.8}$N quantum wells of 2-5 nm thickness separated by barriers composed of In$_{0.10-0.16}$Ga$_{0.9-0.84}$N with 1-6 nm thickness, all nominally un-doped. Active region 16 is followed by a 2-10 nm thick In$_{0.10-0.16}$Ga$_{0.9-0.84}$N cap layer 34, 10-40 nm In$_{0.0-0.13}$Ga$_{1-0.87}$N electron blocking layer 36 doped with Mg to $1\times10^{20}$ cm$^{-3}$, and 60-120 nm thick In$_{0.14}$Ga$_{0.86}$N p-contact layer 38 doped with Mg at a concentration of $1\times10^{18}$ to $1\times10^{19}$ cm$^{-3}$ for the first 85 nm, then ramped to $5\times10^{19}$ to $2\times10^{20}$ cm$^{-3}$ for the final 1-10 nm.

Example 3

An Al-free LED grown on a ScAlMgO$_4$ substrate includes a 1-6 µm thick In$_{0.14}$Ga$_{0.86}$N base layer 12 doped with $1\times10^{18}$ to $1\times10^{19}$ cm$^{-3}$ Si, followed by a spacer composed of In$_{0.10-0.16}$Ga$_{0.9-0.84}$N doped 2e18 to 2e19 cm$^{-3}$ with Si. The active region 16 includes In$_{0.15-0.20}$Ga$_{0.85-0.8}$N quantum wells of 2-5 nm thickness separated by barriers composed of In$_{0.10-0.16}$Ga$_{0.9-0.84}$N with 1-6 nm thickness, all nominally un-doped. This stack is followed by a 2-10 nm thick In$_{0.10-0.16}$Ga$_{0.9-0.84}$N cap layer 34, 10-40 nm In$_{0.0-0.13}$Ga$_{1-0.87}$N electron blocking layer 36 doped with Mg to $1\times10^{20}$ cm$^{-3}$, and 60-120 nm thick In$_{0.14}$Ga$_{0.86}$N p-contact layer 38 doped with Mg at a concentration of $1\times10^{18}$ to $1\times10^{19}$ cm$^{-3}$ for the first 85 nm, then ramped to $5\times10^{19}$ to $2\times10^{20}$ cm$^{-3}$ for the final 1-10 nm.

Example 4

A strain-free LED grown on a ScAlMgO$_4$ substrate includes a 1-6 µm thick Al$_{0.10}$In$_{0.16}$Ga$_{0.74}$N base layer 12 doped with $1\times10^{18}$ to $1\times10^{19}$ cm$^{-3}$ Si, followed by an active region 16 including In$_{0.14}$Ga$_{0.86}$N quantum wells of 2-5 nm thickness separated by barriers composed of Al$_{0.05}$In$_{0.15}$Ga$_{0.80}$N with 1-6 nm thickness, all nominally un-doped. The active region 16 is followed by a 1-10 nm thick Al$_{0.10}$In$_{0.16}$Ga$_{0.74}$N cap layer 34, 5-35 nm thick Al$_{0.30}$In$_{0.20}$Ga$_{0.50}$N electron blocking layer 36 doped with Mg to $1\times10^{19}$ to $1\times10^{20}$ cm$^{-3}$, and a 50-150 nm thick Al$_{0.10}$In$_{0.16}$Ga$_{0.74}$N p-contact layer 38 doped with Mg at a concentration of $1\times10^{18}$ to $1\times10^{19}$ cm$^{-3}$ for the first 85 nm, then ramped to $5\times10^{19}$ to $2\times10^{20}$ cm$^{-3}$ for the final 5 nm.

An advantage of some embodiments of the invention over conventional devices (such as GaN on sapphire, GaN on SiC, GaN on Si) is the opportunity to grow on a substrate that is lattice-matched to the active region, and to use quaternary layers to provide the larger band-gap cladding layers (such as the base layer and p-type layers). In addition, due to the larger lattice constant, quaternary compounds can be grown at a higher growth temperature, improving the quality of these films that have traditionally been of poorer quality due to the incorporation of extrinsic and intrinsic point defects. In addition to BAlGaInN, all layers may have alloys of any III-V material composed of BAlGaInNAsPSb to optimized band structure, morphology and performance of devices.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:
1. A method comprising:
growing a III-nitride structure grown on a substrate, the III-nitride structure comprising a light emitting layer disposed between an n-type region and a p-type region, wherein the III-nitride structure comprises a region including only ternary, quaternary, and/or quinary III-nitride layers and the region including only ternary, quaternary, and/or quinary IIInitride layers is thicker than 2 µm and growing a base region disposed between the substrate and the light emitting layer, the base region comprising a first layer proximate the substrate and a second layer proximate the light emitting layer wherein the net polarization-induced charge at the interface of the first layer and the second layer is zero, the first layer is a quaternary layer Al$_x$In$_y$Ga$_{1-x-y}$N between 3 and 1000 nm, and the second layer is a quaternary layer Al$_x$In$_y$Ga$_{1-x-y}$N of a different composition than the first layer;
attaching the III-nitride structure to a mount; and
removing the substrate, wherein:
the substrate is RAO3(MO)$_n$, where R is one of a trivalent cation, Sc, In, Y, and a lanthanide; A is one of a trivalent cation, Fe (III), Ga, and Al; M is one of a divalent cation, Mg, Mn, Fe (II), Co, Cu, Zn and Cd; and n is an integer≥1;
the substrate has an in-plane lattice constant a$_{substrate}$;
at least one III-nitride layer in the III-nitride structure has a bulk lattice constant a$_{layer}$; and
[(1 a$_{substrate}$−a$_{layer}$|)/a$_{substrate}$]*100% is no more than 1%.
2. The method of claim 1 wherein the substrate is ScAlMgO$_4$.
3. The method of claim 1 wherein the III-nitride structure includes at least one layer that is lattice matched to the substrate.
4. The method of claim 1 wherein the III-nitride structure includes a first layer in direct contact with a second layer, wherein an interface between the first and second layers has no polar charge.
5. The method of claim 4 wherein the first layer is Al$_{0.06}$In$_{0.17}$/Ga$_{0.77}$N and the second layer is In$_{0.14}$Ga$_{0.86}$N.
6. The method of claim 1 wherein growing comprises growing a base region disposed between the substrate and the light emitting layer, the base region comprising a first layer proximate the substrate and a second layer proximate the light emitting layer, wherein the first layer has a smaller band gap than the second layer.
7. The method of claim 6 wherein:
the substrate is ScAlMgO$_4$;
the first layer is one of In$_{0.14}$Ga$_{0.86}$N and quaternary Al$_x$In$_y$Ga$_{1-x-y}$N with a composition x and y that satisfies the relationship y=0.136+0.228*x, x+y≤; 1, that is lattice-matched to the substrate; and
the second layer is one of Al$_{0.06}$In$_{0.17}$Ga$_{0.77}$N, Al$_{0.6}$In$_{0.18}$Ga$_{0.27}$N, and a quaternary layer Al$_x$In$_y$Ga$_{1-x-y}$N with an indium composition y between 0.14 and 0.32 that satisfies x=2*y−0.28.
8. The method of claim 1 wherein at least a portion of the n-type region has a graded composition.

9. The method of claim 1 wherein:
the light emitting layer is part of a multi quantum well light emitting region comprising at least two light emitting layers and at least one barrier layer disposed between the at least two light emitting layers; and
a composition of at least one of the light emitting layers and a composition of the at least one barrier layer are selected such that net strain in the light emitting region is zero.

10. The method of claim 1 wherein:
the light emitting layer is part of a multi quantum well light emitting region comprising at least two light emitting layers and at least one barrier layer disposed between the at least two light emitting layers; and
a composition of the at least one barrier layer is one of a quaternary layer that is lattice-matched to the substrate, GaN, and $In_yGa_{1-y}N$ with an indium composition between 0 and YLEL−0.08, where YLEL is an indium composition of at least one of the light emitting layers.

11. The method of claim 1 wherein the semiconductor structure further comprises a distributed Bragg reflector.

12. The method of claim 11 wherein the distributed Bragg reflector comprises alternating AlInN and InGaN layers.

13. A device comprising:
a substrate;
a III-nitride structure on the substrate, the III-nitride structure comprising a light emitting layer disposed between an n-type region and a p-type region, wherein the IIInitride structure comprises a region including only ternary, quaternary, and/or quinary IIInitride layers and the region including only ternary, quaternary, and/or quinary III-nitride layers is thicker than 2 μm; and
a base region disposed between the substrate and the light emitting layer, the base region comprising a first layer proximate to the substrate and a second layer proximate to the light emitting layer, wherein the net polarization-induced charge at the interface of the first layer and the second layer is zero, the first layer is a quaternary layer $Al_xIn_yGa_{1-x-y}N$ between 3 and 1000, and the second layer is a quaternary layer $Al_xIn_yGa_{1-x-y}N$ of a different composition than the first layer;
wherein the substrate is $RAO3(MO)_n$, where R is one of a trivalent cation, Sc, In, Y, and a lanthanide; A is one of a trivalent cation, Fe (III), Ga, and Al; M is one of a divalent cation, Mg, Mn, Fe (II), Co, Cu, Zn and Cd; and n is an integer≥1;
the substrate has an in-plane lattice constant $a_{substrate}$;
at least one III-nitride layer in the III-nitride structure has a bulk lattice constant $a_{layer}$; and
$[(|a_{substrate} - a_{layer}|)/a_{substrate}]*100\%$ is no more than 1%.

14. The device of claim 13 wherein:
the light emitting layer is configured to emit light having a peak wavelength greater than 440 nm.

15. The device of claim 14 wherein:
strain for each layer in the region of including only ternary, quaternary, and/or quinary III-nitride layers is defined as $[(|a_{bulk} - a_{in-plane}|)/a_{bulk}]*100\%$, where $a_{bulk}$ is a lattice constant of a layer of the same composition as each layer when fully relaxed and $a_{in-plane}$ is a lattice constant of each layer as grown in the device; and
the strain in each layer in the region of including only ternary, quaternary, and/or quinary III-nitride layers is less than 0.8%.

16. The device of claim 13 further comprising a base region disposed between the substrate and the light emitting layer, the base region comprising a first layer proximate the substrate and a second layer proximate the light emitting layer, wherein the first layer has a smaller band gap than the second layer.

17. The method of claim 1, further comprising depositing a smoothing layer between the base region and the light emitting layer, the smoothing layer comprising a band gap larger than a band gap of the light emitting layer.

18. The method of claim 1, further comprising depositing a spacer layer between the base region and the light emitting layer, the spacer layer comprising a band gap larger than a band gap of the light emitting layer.

* * * * *